United States Patent [19]

Hara

[11] 4,081,817
[45] Mar. 28, 1978

[54] SEMICONDUCTOR DEVICE

[75] Inventor: Hisashi Hara, Kamakura, Japan

[73] Assignee: Tokyo Shibaura Electric Co., Ltd., Kawasaki, Japan

[21] Appl. No.: 717,459

[22] Filed: Aug. 24, 1976

[30] Foreign Application Priority Data

Aug. 25, 1975   Japan .................................. 50-102065

[51] Int. Cl.² ...................... H01L 29/80; H01L 29/78
[52] U.S. Cl. .......................................... 357/23; 357/22
[58] Field of Search ................................... 357/22, 23

[56] References Cited

U.S. PATENT DOCUMENTS

| 3,821,776 | 6/1974 | Hayashi et al. | 357/23 |
| 3,828,230 | 8/1974 | Nishizawa et al. | 357/23 |
| 3,868,274 | 2/1975 | Hubar et al. | 357/23 |

Primary Examiner—Edward J. Wojciechowicz
Attorney, Agent, or Firm—Oblon, Fisher, Spivak, McClelland & Maier

[57] ABSTRACT

An insulated gate FET comprises a semiconductor substrate, source and drain regions formed in the surface of the semiconductor substrate in a manner spaced at a prescribed interval from each other, and a gate electrode provided on a surface portion of the substrate between the source and drain regions through an insulation layer. Depletion layers formed by the action of a buit-in-field are spread, respectively, into said semiconductor substrate from the source and drain regions, and these two depletion layers contact each other.

4 Claims, 7 Drawing Figures

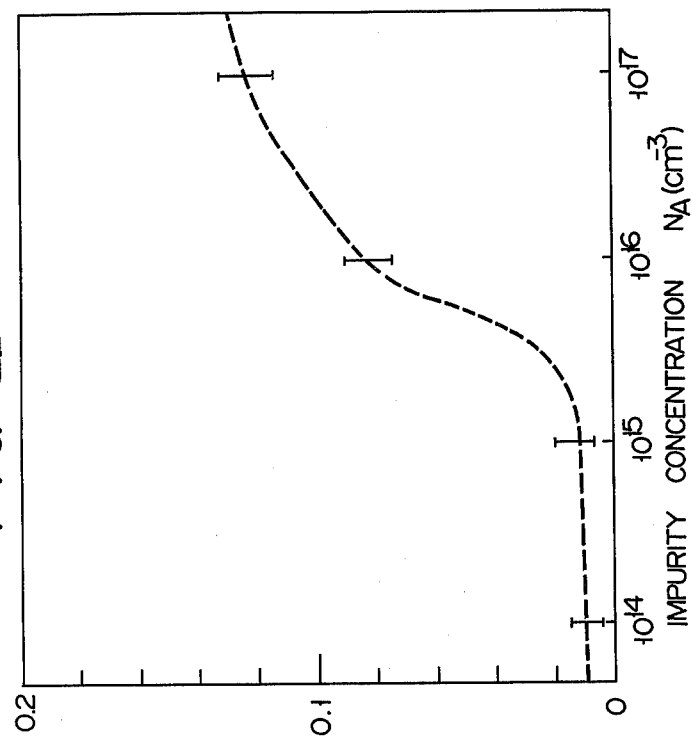
FIG. 1
FIG. 2A
FIG. 2B
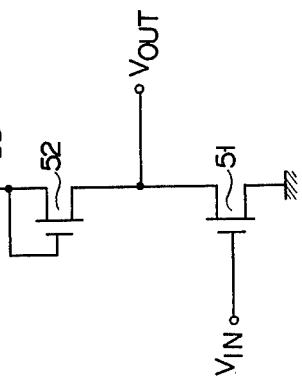
FIG. 5

SEMICONDUCTOR DEVICE

BACKGROUND OF THE INVENTION

This invention relates to an improvement of an insulated gate field effect transistor, and more particularly to a semiconductor device suitable to conversion into a high density integrated circuit (IC).

A generally known insulated gate field effect semiconductor device, for example, n channel MOS transistor (n channel Metal Oxide Semiconductor Transistor) has the following construction. This n channel MOST is constructed such that an n type source region and an n type drain region are formed in a p type silicon substrate in a manner spaced at a prescribed interval from each other; and a gate electrode is provided on a surface portion of the p type silicon substrate between the source and drain regions through a silicon dioxide film ($SiO_2$) as an insulator. This n channel MOST is a voltage-controlled semiconductor device arranged to control a channel conductance produced between the source and drain regions by the voltage applied to the gate electrode, thereby to control the current flowing through the channel region between the source and drain regions.

In recent years, with regards to a semiconductor device using this type of element, it is demanded to miniaturize the MOST or element itself and especially to shorten the channel length thereof as a result of the demand for conversion of the device into a higher density integrated circuit. At present, however, it is very difficult, from the standpoint of MOST manufacture, to actually determine the channel length to a specified value with high accuracy. This means that upon MOST manufacture variations with occur in the channel length. In the case of the channel length of a presently used MOST, its variation do not go so far as to influence the element characteristics to so large an extent. But, the smaller the channel length, the higher the degree of its variation, and this poses a problem of having serious effect upon the MOST characteristics.

The effect, of the channel length variation upon the MOST element characteristics, namely the element characteristic variation resulting from the channel length variation, includes the variation in mutual conductance (gm) and the variation in gate threshold voltage ($V_T$). The variation in the former or mutual conductance (gm) comes out as a change in the amount of current flowing in the transistor itself and, when viewed from the standpoint of the integrated circuit, comes out only as a change in the switching rate. The variation in the latter or gate threshold voltage ($V_T$) becomes a cause of the logical erroneous operation of, for example, the digital circuit, resulting in raising a very serious problem.

SUMMARY OF THE INVENTION

Accordingly, an object of the invention is to provide an insulated gate field effect semiconductor device whose channel length is capable of being shortened to be made suitable to conversion into a high density integrated circuit.

Another object of the invention is to provide an insulated gate field effect semiconductor device whose gate threshold voltage will remain to have a specified range of values even if, when the device has been so manufactured as to have a small channel length, this channel length is varied.

Still another object of the invention is to provide a semiconductor device suitable to use in a digital circuit.

The semiconductor device according to the invention comprises a semiconductor substrate, source and drain regions formed in the surface of the semiconductor substrate in a manner spaced at a prescribed interval from each other, and a gate electrode provided on a surface portion of said substrate between said source and drain regions through an insulation layer. In this semiconductor device, respective impurity concentrations of the semiconductor substrate, source region, and drain region are so determined that depletion layers formed by the action of a built-in-field and spread, respectively, into said semiconductor substrate from the source and drain regions contact each other.

BRIEF DESCRIPTION OF THE DRAWING

FIG. 1 is a vertical sectional view of an n channel MOS-FET according to an embodiment of this invention;

FIGS. 2A, 2B and 2C graphically show the amount of variation $\Delta V_T$ in gate threshold voltage, as occurring with variation in channel length, relative to the impurity concentration $N_A$ of the substrate;

FIG. 5 is a circuit diagram showing the semiconductor device of the invention applied to an inverter.

DETAILED DESCRIPTION OF THE PREFERRED EMBODIMENTS

Figure 3:
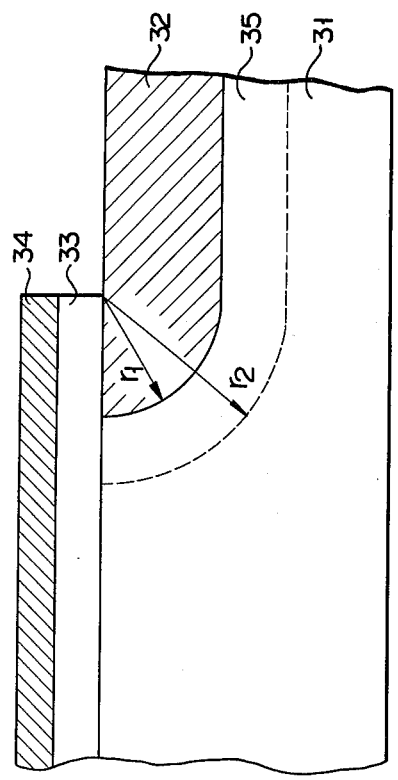
FIG. 3 is an explanatory sectional view of a MOS-FET showing as a model the vicinity of a drain region thereof.

FIG. 1 shows an n channel MOS-FET structure of a semiconductor device according to the invention. The n channel MOS-FET shown in FIG. 1 is constructed such that, as usually known, an $n^+$ type source region 2 and drain region 3 are formed in the surface of a p type silicon substrate 1 with a prescribed interval set therebetween; on the surface portion of the p type silicon substrate 1 between the source region 2 and the drain region 3 a gate electrode 5 is provided through a gate insulation layer or a silicon dioxide layer 4; and on the remaining surface of the p type silicon substrate 1 a field oxide film 6 is formed. In this type of MOS transistor according to the invention, the respective impurity concentrations of the source region 2, drain region 3 and p type silicon substrate 1 are so determined that depletion layers 7, 8 spread, respectively, into the p type silicon substrate 1 from the source region 2 and the drain region 3 contact with each other as shown in FIG. 1, namely cover a channel region 10 between the source region 2 and the drain region 3. These depletion layers 7, 8 are the ones which are formed or produced by a built-in-field under a condition in which no voltage is applied from an external circuit, or under a condition in which thermal equilibrium, as viewed from the standpoint of physical property, is held, and which are formed mainly due to the differences in respect of impurity concentration between the source region 2 and the p type silicon substrate 1 and between the drain region 3 and the p type silicon substrate 1. Naturally, the depletion layers 7, 8 can be spread not only into the p type silicon substrate 1 but also into the source region 2 and the drain region 3, but under a condition in which the n type region is of extremely high impurity concentration and the impurity concentration of the p type substrate is lower than that of the n type region the depletion layers may be considered as being little spread into the source region 2 and the drain region 3. In any case, this invention deals with the depletion layers 7, 8 spread or extended into the p type silicon substrate 1 from the source region 2 and the drain region 3, and the semiconductor device of the invention is so constructed that the two depletion layers 7, 8 cover the channel region 10 produced between the source region 2 and the drain region 3.

Even if, owing to the fact that, as above described, the MOS transistor is so constructed that the depletion layers extended, respectively, into the p type silicon substrate 1 from the source region 2 and the drain region 3 contact each other, variations take place in the channel length between the source region 2 and the drain region 3 of the n channel MOS transistor, this invention will be able to provide an effect that this transistor can have a prescribed range of gate threshold voltage values.

The reasons why such effect can be obtained will now be concretely explained by the use of experimental data and the theoretical formula based thereupon.

Figure 2C:
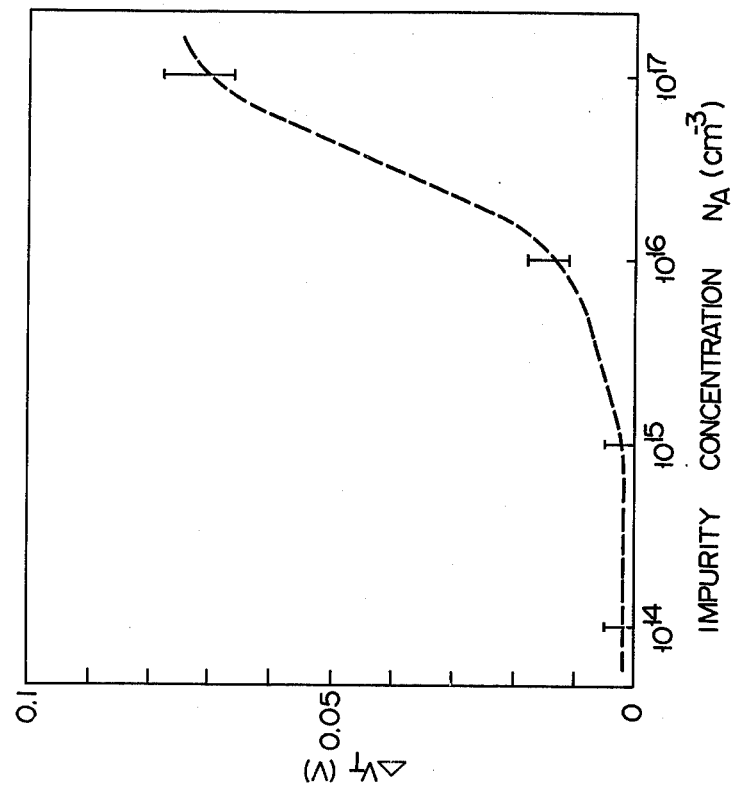

In each of FIGS. 2A, 2B and 2C, there is shown the degree of variation, or the amount of variation $\Delta V_T$ in gate threshold voltage $V_T$ of the n channel MOS transistor, as occurring with variation in channel length, relative to the impurity concentration $N_A$ (cm$^{-3}$) of the p type silicon substrate 1. The transistor samples used to provide the experimental data shown in FIGS. 2A, 2B and 2C are each a MOS transistor wherein the source region 2 and the drain region 3 each have a uniform depth of 0.3$\mu$ and an n type impurity concentration of ordinary value e.g. about $10^{21}$(cm$^{-3}$). Further, said transistor samples used are each a MOS transistor whose p type silicon substrate 1 has a p type impurity concentration of $10^{14}$ to $10^{17}$(cm$^{-3}$).

Measurement of the above-mentioned MOS transistor samples was carried out as follows. A number of MOS transistors were prepared beforehand which p type silicon substrates 1 each had a p type impurity concentration of, for example, $10^{14}$(cm$^{-3}$) and which channel lengths each had a substantially prescribed value; the gate threshold voltage $V_{T(sample)}$ of each said MOS transistor sample was measured; and thereafter through close measurement the channel length thereof was precisely measured. Next, from a number of said MOS transistor samples subject to measurement of channel length, the samples whose channel lengths each have an error of ±20% per prescribed unit length of channel, for example, 1$\mu$ were selected and the measured values of their gate threshold voltages $V_{T(sample)}$ were sampled. From said sampled gate threshold voltage values $V_{T(sample)}$ the amount of gate threshold voltage variation $\Delta V_T$ is graphically plotted. Accordingly, the numerical value range shown in each graph in the form of an alphabetic letter "I" indicates the amount range of gate threshold voltage variation $\Delta V_T$ of each sampled MOS transistor, in other words, the range of variation in the actual measured value of the gate threshold voltage of the MOS transistors each having a variation of ±20% in terms of channel length. Now, explanation is concretely made of the method of plotting into the graph the amount range of gate threshold voltage $V_T$ variation. For example, when it is assumed that the gate threshold voltages $V_T$ of three samples each having a specified n type impurity concentration $N_A$ are 0.1992 [V], 0.2002 [V], and 0.2007 [V], the maximum value of the amount of variation $\Delta V_T$ is $(2.007 - 1.992) = 0.015$[V], while the minimum value thereof is $(2.007 - 2.002) = 0.005$[V]. If such calculation is made with respect to a large number of measured gate threshold voltages, the graphs of FIGS. 2A to 2C will be obtained.

Note that the gate threshold voltage $V_T$ was measured by graphically plotting the relation between the gate voltage and the drain current established when the drain voltage of 50 mV has been applied to the drain region and determining by extraporation a gate voltage value permitting the drain current to become zero from a curve obtained by connecting the points of measured plotted values; and the curve shown by a broken line in each of FIGS. 2A, 2B and 2C is obtained by connecting respective average values of the amounts of gate threshold voltage variation $\Delta V_T$ each indicated by the form of "I".

Hereinafter, explanation will in turn be made of the graphs each pictured by plotting the values measured by the abovementioned method.

FIG. 2A is a graphic diagram showing the measured results of the samples which channel length in average is 1.0$\mu$ and which gate oxide film thickness is 300 angstroms. What is obvious from this graphic diagram is that when the p type impurity concentration $N_A$ of the silicon substrate 1 is increased up to a value of about $10^{15}$(cm$^{-3}$) or more, the value of $\Delta V_T$ becomes extremely great. Namely, when said p type impurity concentration is increased up to the value of $10^{16}$(cm$^{-3}$) and $10^{17}$(cm$^{-3}$), the average values of the corresponding amounts of gate threshold voltage $V_T$-variation become 0.025[V] and 0.03[V], respectively. Accordingly, in the case where the average channel length is 1.0$\mu$, said p type impurity concentration is required to be $10^{15}$(cm$^{-3}$) or less.

FIGS. 2B is a graphic diagram showing the measured results of the samples which channel length in average is 0.5$\mu$ and which gate oxide film thickness is 300 angstroms. In this graphic diagram, as in the case of that in FIG. 2A, the p type impurity concentration $N_A$ has a critical value when viewed from the relation between $N_A$ and $\Delta V_T$. Namely, when the $N_A$ becomes more than an intermediate value between $10^{15}$ and $10^{16}$ (cm$^{-3}$), the $V_T$ becomes much greater.

FIG. 2C is a graphic diagram showing the measured results of the samples whose channel length in average is 0.3$\mu$ and whose gate oxide film thickness is 100 angstroms. As seen from this graphic diagram, the $N_A$ value of about $10^{16}$ (cm$^{-3}$) is one critical value with respect to $\Delta V_T$.

As apparent from the foregoing explanation, it can be said that with respect to each channel length, one critical value of the $N_A$ exists, and that the $N_A$ value regarded as that critical value becomes all the greater as the channel length becomes smaller.

The reason why such phenomenon takes place is not clear at present. It has turned out, however, that when analysis is made from the standpoint of physical property, a specified relation exists between the depletion layer and the impurity concentration $N_A$ kept under a condition of thermal equilibrium. This specific relation will now be explained by reference to FIGS. 3 and 4.

FIG. 3 is a sectional view of a MOS transistor showing as a model the vicinity of a drain region thereof. In this sectional view, a reference numeral 31 denotes a substrate, 32 the drain region, 33 a gate oxide film, and 34 a gate electrode. A reference numeral 35 denotes a depletion layer spread into the substrate 1 from the drain regions 32, said depletion layer being formed by a built-in-field. Assume now that $r_1$ represents the distance by which the impurity forming the drain region 32 is diffused over an area beneath the gate oxide film 33, namely the distance from the rightward end of the gate oxide film 33 to the leftward end of the drain region 32, and $r_2$ the distance from said rightward end of the gate oxide film 33 to the leftward end of the depletion layer 35 spread toward a channel region. Then, the distance from said leftward end of the drain region 32 to said leftward end of the depletion layer 35, i.e., the width of the depletion layer is represented by $(r_2-r_1)$.

The formation of the depletion layer having a width of $(r_2-r_1)$ is based on the presence of a potential barrier which exists, under the condition wherein the drain voltage is zero or a condition of thermal equilibrium, at the $pn$ junction between the drain region and the substrate.

The Fermi-level of the $n^+$ drain region kept under a condition of thermal equilibrium is considered to exist at the bottom of a conductive zone of the substrate, and therefore the height of the potential barrier between the drain region and the substrate is given by the following formula.

$$E_g/2 + \phi_F$$

where $E_g$ represents the width of an energy-forbidden band of the silicon substrate and $\phi_F$ the Fermi-level of the substrate semiconductor.

Where the depletion layer 35 $(r_2-r_1)$ thick, spread into the substrate 31 from the drain region 32 is assumed to produce a circularly spreading electric field, the following relation results.

$$\frac{E_g}{2} + \phi_F = \frac{qN_A}{2\epsilon_s} r_1^2 [(\frac{r_2}{r_1})^2 \ln(\frac{r_2}{r_1}) - 0.5(\frac{r_2}{r_1})^2 + 0.5]$$

where $r_1 = 0.3\mu$, $E_g = 1.12$eV, $\phi_F$ is determined in corresponding relation to $N_A$ value, $q$ represents the amount of free electrons $1.602 \times 10^{-19}$c, and $\epsilon_s$ represents a dielectric constant of the silicon substrate. Th sum $2(r_2-r_1)$ ($\mu$) of the thickness $(r_2-r_1)$ ($\mu$) of each depletion layer and the thickness $(r_2-r_1)$ ($\mu$) of a corresponding depletion layer spread into the substrate also from a source region similarly to the drain region side, both said depletion layer thickness being calculated relative to the impurity concentration $N_A$(cm$^{-3}$) derived from the above relation formula, is presented in the following table.

| $N_A$(cm$^{-3}$) | $(r_2-r_1)(\mu)$ | $2(r_2-r_1)(\mu)$ |
|---|---|---|
| $10^{14}$ | 1.64 | 3.27 |
| $10^{15}$ | 0.62 | 1.23 |
| $10^{16}$ | 0.22 | 0.45 |
| $10^{17}$ | 0.075 | 0.15 |

Figure 4:
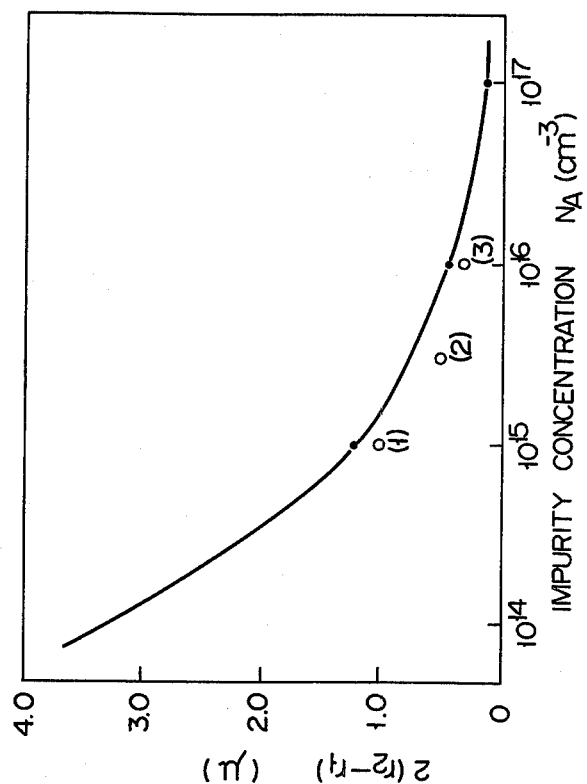
FIG. 4 graphically shows the relation of the impurity concentration of the substrate with two depletion layers spread, respectively, into the substrate from the source region and drain region, as theoretically derived from a model of the MOS-FET shown in FIG. 3, the plots (1), (2) and (3) indicating critical points in the graphs of FIGS. 2A, 2B and 2C.

The relation between said $p$ type impurity concentration $N_A$ and said sum $2(r_2-r_1)$ ($\mu$) of both depletion layer thicknesses is graphically shown in FIG. 4.

In FIG. 4, the critical values of the $N_A$ obtained from the previously mentioned experimental data are shown labelled (1), (2) and (3), respectively. The marked critical values (1), (2) and (3) are indicated with the $N_A$ in FIGS. 2A, 2B and 2C plotted on the abscissa and the average channel length of the MOS transistor samples on the ordinate.

The following will be understood from the graphic diagram of FIG. 4. Namely, the plots (1), (2) and (3) of the average channel length relative to the $p$ type impurity concentration $N_A$ at the critical points are dotted in an area below a curve denoting the sum $2(r_2-r_1)$ of the depletion layer thicknesses relative to the $N_A$. For example, where the substrate has a $p$ type impurity concentration $N_A$ of $10^{15}$(cm$^{-3}$), the sum $2(r_2-r_1)$ of the resulting depletion layer thicknesses is 1.23$\mu$, whereas the average channel length is 1.0$\mu$. This means that where the depletion layer thickness sum $2(r_2-r_1)$ is greater than the average channel length, in other words where the channel is covered by the depletion layers, the amount of gate threshold voltage variation $\Delta V_T$ is extremely small. If, accordingly, the $p$ type impurity concentration and channel length of the substrate are determined selectively from the above-mentioned area below the curve of FIG. 4, it will provide a MOS transistor having a prescribed gate threshold voltage.

An example of the insulated gate field effect transistor of the invention applied, where used as IC of a digital circuit, to a fundamental circuit thereof, e.g., an inverter will now be described by reference to FIG. 5. In FIG. 5, a reference numeral 51 denotes a drive transistor, and 52 a load transistor. Where such a digital circuit is formed into a compact size, the power source voltage of a circuit element thereof is as low as 2 volts and sometimes the gate threshold voltage $V_T$ of a drive transistor in this circuit element is 0.1 to 0.2 volt. Where, in such a case, the channel length is made short, the amount of gate threshold voltage variation $\Delta V_T$ sometimes becomes large, for example, about 0.1 volt when the channel length of the drive transistor presents a large variation. As a result, in the inverter involved, the gate threshold voltage $V_T$ of the drive transistor becomes almost zero, whereby the digital circuit is likely to make an erroneous operation. According to the insulated gate field effect transistor of the invention, the channel length thereof can be decreased and simultaneously the variation in the gate threshold voltage is extremely small, to permit the miniaturization of the circuit element and prevent an erroneous operation of the circuit due to the variation in the gate threshold voltage.

The foregoing description has been made by using especially the $n$ channel MOS transistor, but as apparent from the subject matter of the invention, this invention can be applied similarly to a $p$ channel MOS transistor. Further, according to the invention similarly to the $n$ channel MOS transistor, the $p$ channel MOS transistor also permits the circuit element itself to be integrated with high density and provides suitable circuit characteristics as already stated. Further, obviously, this invention can be applied to any one of both enhancement type-and depression type-MOS transistors.

What is claimed is:

1. An insulated gate field effect transistor capable of miniaturization in which variations in the gate threshold voltage are maintained very small in spite of changes in channel length, comprising:
    a semiconductor substrate of a first conductivity type, source and drain regions of a second conductivity type formed in a first surface of said substrate, and spaced a predetermined distance apart, a channel region formed in said substrate between said source and drain regions, said channel region less than 4 microns in length:

an insulated gate electrode coupled to said first surface of said semi-conductor substrate adjacent said channel region, said source and drain regions having impurity concentrations much higher than that of said substrate so that depletion layers are formed in said substrate, said depletion layers spreading into said substrate from said source and drain regions, and joining one another in said channel region, whereby variations in said gate threshold voltage are maintained small in spite of changes in length of said channel region.

2. A semiconductor device according to claim 1, wherein said semiconductor substrate is a $p$ type impurity semiconductor substrate, and said source and drain regions are each an $n$ type semiconductor region.

3. A semiconductor device according to claim 1, wherein said semiconductor substrate in an $n$ type impurity semiconductor substrate, and said source and drain regions are each a $p$ type semiconductor region.

4. A semiconductor device according to claim 1 wherein in said channel region produced between said source and drain regions, the impurity concentration of said semiconductor substrate is $10^{16}(cm^{-3})$ or less, and the length of said channel region is between 0.3 and 4 microns.

* * * * *